United States Patent
Franchini et al.

(10) Patent No.: US 9,851,392 B2
(45) Date of Patent: Dec. 26, 2017

(54) GROUND-LOSS DETECTION CIRCUIT

(71) Applicants: Christelle Franchini, Fontenilles (FR); Alexis Huot-Marchand, Fonsorbes (FR)

(72) Inventors: Christelle Franchini, Fontenilles (FR); Alexis Huot-Marchand, Fonsorbes (FR)

(73) Assignee: NXP USA, Inc., Austin, TX (US)

(*) Notice: Subject to any disclaimer, the term of this patent is extended or adjusted under 35 U.S.C. 154(b) by 38 days.

(21) Appl. No.: 14/759,204

(22) PCT Filed: Jan. 10, 2013

(86) PCT No.: PCT/IB2013/000104
§ 371 (c)(1),
(2) Date: Jul. 3, 2015

(87) PCT Pub. No.: WO2014/108715
PCT Pub. Date: Jul. 17, 2014

(65) Prior Publication Data
US 2015/0355260 A1    Dec. 10, 2015

(51) Int. Cl.
*G01R 31/14* (2006.01)
*G01R 31/04* (2006.01)
*G01R 31/28* (2006.01)

(52) U.S. Cl.
CPC ......... *G01R 31/04* (2013.01); *G01R 31/2851* (2013.01)

(58) Field of Classification Search
CPC .. G01R 31/04; G01R 31/2851; G01R 31/025; G01R 31/086; G01R 27/18
(Continued)

(56) References Cited

U.S. PATENT DOCUMENTS 6,208,494 B1* 3/2001 Nakura ............... H01L 27/0266
                                                       361/111
6,560,079 B1    5/2003 Hirsh et al.
(Continued)

FOREIGN PATENT DOCUMENTS

EP    0519156    12/1992
EP    1305922    12/2004
(Continued)

OTHER PUBLICATIONS

International Search Report and Written Opinion correlating to PCT/IB2013/000104 issued on Sep. 26, 2013.
(Continued)

*Primary Examiner* — Thang Le

(57) ABSTRACT

A ground-loss detection circuit for an integrated circuit, (IC) device including a first dynamic threshold metal oxide semiconductor (DTMOS) device operably coupled between a first ground plane of the IC device and at least one further ground plane of the IC device, at least one of the first and at least one further ground planes comprising an external ground connection of the IC device, at least one further DTMOS device operably coupled between the first and at least one further ground planes of the IC device in an opposing manner to the first DTMOS device, and at least one ground-loss detection component operably coupled to at least one of the first and at least one further DTMOS devices and arranged to detect a ground-loss for at least one of the first and at least one further ground planes based at least partly on a drain current of the at least one of the first and at least one further DTMOS device(s).

15 Claims, 3 Drawing Sheets

(58) Field of Classification Search
USPC ....... 324/509, 512, 520, 521, 522, 525–528, 324/531, 537, 555
See application file for complete search history.

(56) References Cited

U.S. PATENT DOCUMENTS

| | | | | |
|---|---|---|---|---|
| 7,265,955 | B2* | 9/2007 | Fink | H02H 5/105 |
| | | | | 361/42 |
| 7,760,476 | B2 | 7/2010 | Riviere et al. | |
| 7,876,541 | B2* | 1/2011 | Moon | H02H 9/046 |
| | | | | 361/56 |
| 7,924,084 | B2* | 4/2011 | Kojima | H03K 17/063 |
| | | | | 323/364 |
| 8,937,797 | B2* | 1/2015 | Pirchio | G01R 31/026 |
| | | | | 330/264 |
| 2003/0076645 | A1* | 4/2003 | Ker | H01L 27/0266 |
| | | | | 361/111 |
| 2008/0106831 | A1 | 5/2008 | Lewinski et al. | |
| 2009/0002055 | A1* | 1/2009 | Kojima | H03K 17/063 |
| | | | | 327/434 |
| 2009/0040668 | A1* | 2/2009 | Chen | H01L 27/0285 |
| | | | | 361/56 |
| 2009/0102488 | A1 | 4/2009 | Morini et al. | |
| 2010/0045328 | A1* | 2/2010 | Suto | G01R 31/046 |
| | | | | 324/754.01 |
| 2010/0134182 | A1* | 6/2010 | Kapoor | H01L 27/0629 |
| | | | | 327/541 |
| 2014/0092500 | A1 | 4/2014 | Givelin et al. | |

FOREIGN PATENT DOCUMENTS

| | | |
|---|---|---|
| KR | 1019960036033 | 10/1996 |
| KR | 1019980056168 | 9/1998 |

OTHER PUBLICATIONS

Fariborz Assaderaghi, Dennis Sinitsky, Stephen A. Parke, Jeffrey Bokor, Ping K. Ko, Chenming Hu; "Dynamic Threshold-Voltage MOSFET (DTMOS) for Ultra-Low Voltage VLSI"; IEEE Transactions on electronic devices, vol. 44, No. 3, Mar. 1997.

* cited by examiner

GROUND-LOSS DETECTION CIRCUIT

FIELD OF THE INVENTION

This invention relates to a ground-loss detection circuit for an integrated circuit device.

BACKGROUND OF THE INVENTION

In the field of integrated circuit (IC) devices, a broken ground connection (ground loss) can lead to incorrect and uncontrolled behaviour of the IC device. It is therefore desirable for any ground loss to be detectable in any IC device, and in safety critical applications (for example automotive applications such as engine control, anti-lock braking system (ABS), electronic stability program (ESP), airbag control, etc.), it is essential that the disconnection of a ground pin or bonding is detected in order to guarantee safe operation. Accordingly, such ground loss detection is a part of the ASIL (Automotive Safety Integrity Level) D requirements.

SUMMARY OF THE INVENTION

The present invention provides a ground-loss detection circuit for an integrated circuit device, an integrated circuit device comprising such a ground-loss detection circuit, and a method of providing ground-loss detection within an integrated circuit device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
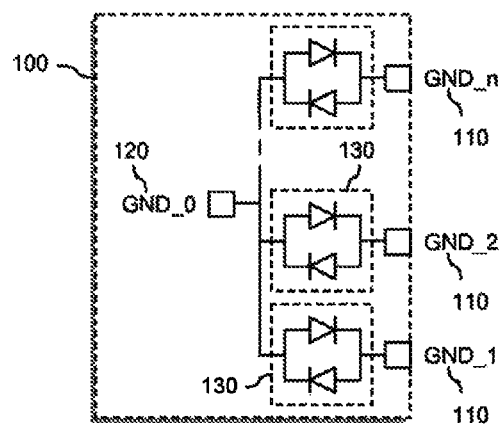
FIG. 1 illustrates a simplified example of an integrated circuit device comprising a plurality of external ground connections.

The present invention will now be described with reference to the accompanying drawings in which an example of a ground-loss detection circuit is described and illustrated. However, it will be appreciated that the present invention is not limited to the specific examples illustrated and described herein. For example, in the illustrated example a ground-loss detection circuit comprising n-type dynamic threshold metal oxide semiconductor (DTMOS) devices has been illustrated and described. However, it will be appreciated that the present invention is not limited to the use of such n-type DTMOS devices.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

In summary, and according to some examples of the present invention, there is provided a ground-loss detection circuit for an integrated circuit (IC) device. The ground-loss detection circuit comprises a first dynamic threshold metal oxide semiconductor (DTMOS) device operably coupled between a first ground plane of the IC device and at least one further ground plane of the IC device, at least one of the first and at least one further ground planes comprising an external ground connection of the IC device, at least one further DTMOS device operably coupled between the first and at least one further ground planes of the IC device in an opposing manner to the first DTMOS device, and at least one ground-loss detection component operably coupled to at least one of the first and at least one further DTMOS devices and arranged to detect a ground-loss for at least one of the first and at least one further ground planes based at least partly on a drain current of the at least one of the first and at least one further DTMOS device(s).

In some further examples, a drain and gate of the first DTMOS device may be operably coupled to the first ground plane, and a source of the first DTMOS device is operably coupled to the at least one further ground plane, and a drain and gate of the at least one further DTMOS device are operably coupled to the at least one further ground plane, and a source of the at least one further DTMOS device is operably coupled to the first ground plane.

In some further examples, at least one resistance/capacitance circuit may be operably coupled across at least one of the first and at least one further DTMOS device.

In some further examples, the at least one ground-loss detection component may be operably coupled to the at least one of the first and at least one further DTMOS devices via a resistance element of the at least one resistance/capacitance circuit.

In some further examples, the at least one ground-loss detection component may comprise at least one current mirror DTMOS device arranged to form a current mirror configuration with the at least one of the first and at least one further DTMOS device. For example, a drain of the at least one current mirror DTMOS device may be operably coupled to a current source via at least one detection resistance, and the at least one ground-loss detection component may be arranged to detect a ground-loss for the at least one of the first and at least one further ground planes based at least partly on a voltage drop across the at least one detection resistance.

In some further examples, the at least one ground-loss detection component may further comprise at least one ground-loss detection p-channel metal oxide semiconductor (PMOS) device, a gate and source of the at least one ground-loss detection PMOS device being operably coupled across the at least one detection resistance, and a drain of the at least one ground-loss detection PMOS device providing a ground-loss detection signal.

Referring first to FIG. 1, there is illustrated a simplified example of an integrated circuit device 100 comprising a plurality of external ground connections GND_1 to GND_n 110. The external ground connections 110 are arranged to be operably coupled to one or more external ground plane(s), and in some examples may comprise pins, bonding pads, solder balls, or any other suitable form of IC packaging connection. In the illustrated example, the external ground connections GND_1 to GND_n 110 are operably coupled to one or more internal ground planes of the IC device 100, such as the internal ground plane GND_0 120. In particular, each of the external ground connection GND_1 to GND_n 110 is operably coupled to the (respective) internal ground plane 120 via an ESD (electrostatic discharge) protection circuit 130 comprising a back-to-back diode arrangement. The use of such a back-to-back diode arrangement between ground planes is a well-known ESD protection strategy.

Figure 2:
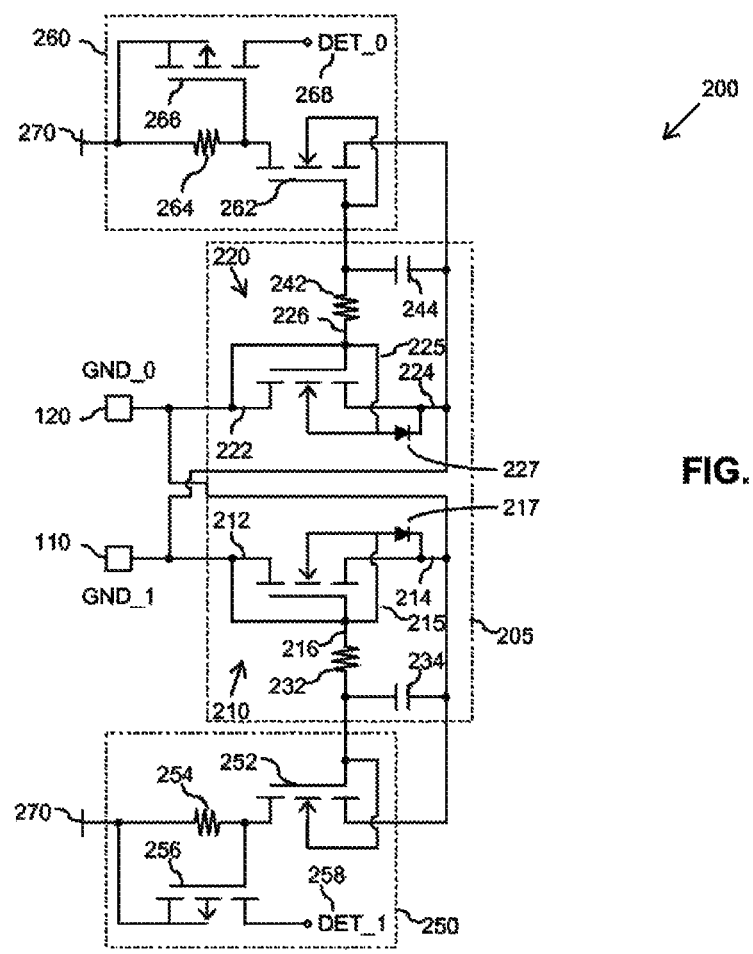
FIGS. 2 to 4 illustrates a simplified circuit diagram of an example of a ground-loss detection circuit.
Figure 3:
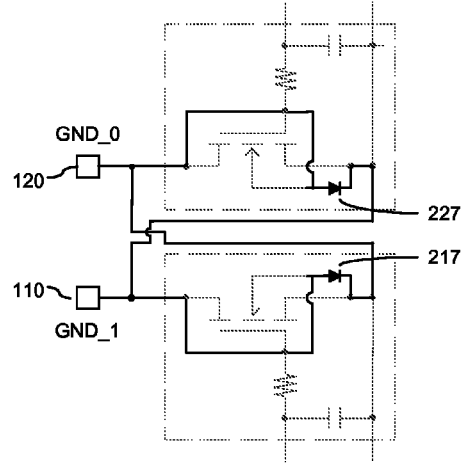
Figure 4:
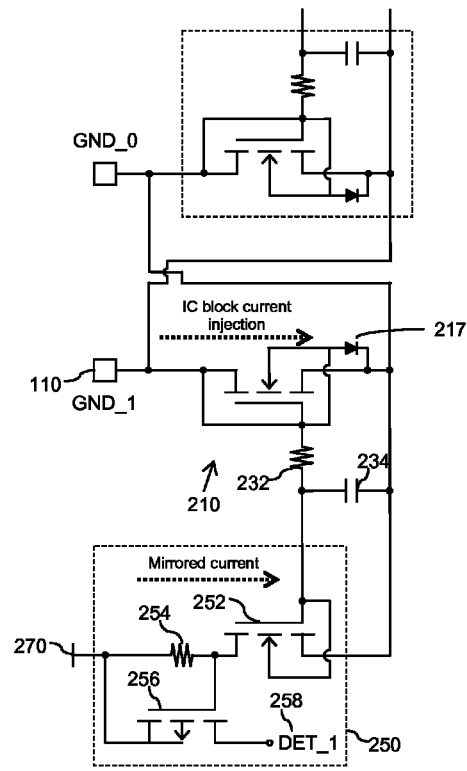

Referring now to FIGS. 2 to 4, there is illustrated a simplified circuit diagram of an example of a ground-loss detection circuit 200, such as may be implemented within the IC device 100 of FIG. 1, and arranged to detect a broken or incomplete external ground connection (ground-loss). In the illustrated example, the ground-loss detection circuit of FIG. 2 is arranged to detect a ground-loss at the external ground connection GND_1 110, and comprises a first dynamic threshold metal oxide semiconductor (DTMOS) device 210 and a second DTMOS device 220 operably coupled between the external ground connection GND_1 110 and the internal ground plane GND_0 120. In particular, a drain 212 and gate 216 of the first DTMOS device 210 are operably coupled to the external ground connection GND_1 110, and a source 214 of the first DTMOS device 210 is operably coupled to the internal ground plane GND_0 120. Conversely, a drain 222 and gate 226 of the second DTMOS device 220 are operably coupled to the internal ground connection GND_0 120, and a source 224 of the second DTMOS device 220 is operably coupled to the external ground connection GND_0 120. As such, the first and second DTMOS devices 210, 220 may be considered to be opposingly coupled between the external ground connection GND_1 110 and the internal ground plane GND_0. Thus, the first and second DTMOS devices 210, 220 form the basis of a cross-coupled DTMOS component 205 of the ground-loss detection circuit 200 illustrated in FIGS. 2 to 4.

As a result of the first and second DTMOS devices 210, 220 being operably coupled between the external ground connection GND_1 110 and the internal ground plane GND_0 120 in this opposing manner, parasitic body-source diode structures within the first and second DTMOS devices 210, 220, illustrated generally at 217, 227 respectively and illustrated more clearly in FIG. 3, form a back-to-back diode arrangement, comparable to the back-to-back diode arrangement illustrated in FIG. 1 implemented between ground planes as an ESD protection strategy. Accordingly, such an opposing arrangement of the first and second DTMOS devices 210, 220 between the external ground connection GND_1 110 and the internal ground plane GND_0 120 in this manner provides ESD protection between the external ground connection GND_1 110 and the internal ground plane GND_0 120.

In some examples, a resistance and capacitance (RC) circuit may be operably coupled across each DTMOS device to provide protection to the DTMOS devices against Automotive ESD (ElectroStatic Discharge) stresses and EMC (Electromagnetic Compatibility) susceptibility stresses. Accordingly, in the illustrated example, a resistance 232 and capacitance 234 are illustrated as being operably coupled between the drain/gate 212, 216 and the source 214 of the first DTMOS device 210, and a resistance 242 and capacitance 244 are operably coupled between the drain/gate 222/226 and the source 224 of the second DTMOS device 220. In this manner, in the event of a voltage spike or voltage ringing (e.g. due to the inductance of bond wires etc.) occurring at one of the ground planes 110, 120, the RC circuits across the DTMOS devices 210, 220 will provide protection to the respective DTMOS devices 210, 220.

The ground-loss detection circuitry 200 further comprises one or more ground-loss detection components, and in the illustrated example comprises a first ground-loss detection component 250 operably coupled to the gate 216 of the first DTMOS device 210 (via resistance 232) and a second ground-loss detection component 260 operably coupled to the gate 226 of the second DTMOS device 220 (via resistance 242). In the illustrated example, each ground-loss detection component 250, 260 comprises a DTMOS device 252, 262 arranged to form a current mirror configuration with the respective DTMOS device 252, 262 of the cross-coupled DTMOS component 205 of the ground-loss detection circuit 200. Accordingly, the first ground-loss detection component 250 comprises a current mirror DTMOS device 252, a gate and source of which are operably coupled to the gate 216 and source 214 respectively of the first DTMOS device 210 of the cross-coupled DTMOS component 205. Similarly in the illustrated example, the second ground-loss detection component 260 comprises a current mirror DTMOS device 262, a gate and source of which are operably coupled to the gate 226 and source 224 respectively of the second DTMOS device 220 of the cross-coupled DTMOS component 205. The respective drains of the current mirror DTMOS devices 252, 252 are operably coupled to a current supply 270 via respective detection resistances 254, 264. In this manner, a voltage drop across the detection resistances 254, 264 is directly proportional to the current flowing through the respective current mirror DTMOS devices 252, 262, and thus also of the current flowing through the respective DTMOS devices 210, 220 in the cross-coupled DTMOS component 205.

Each ground-loss detection component 250, 260 further comprises a ground-loss detection device operably coupled across the resistance 254, 264 of the respective ground-loss detection component 250, 260. In the illustrated example, each of the ground-loss detection devices comprises a p-channel metal oxide semiconductor (PMOS) device 256, 266, a gate and source of which are operably coupled across the resistance 254, 264 of the respective ground-loss detection component 250, 260. In this manner, when the potential difference across the resistance 254, 264 of one of the ground-loss detection components 250, 260 exceeds the threshold voltage for the respective ground-loss detection device 256, 266, the ground-loss detection device 256, 266 is switched 'on', allowing current to flow there through. Thus, a drain of each of the ground-loss detection PMOS devices 256, 266 in the illustrated example may provide a respective ground-loss detection signal 258, 268.

FIG. 4 illustrates an example of the detection of a ground-loss at the external ground connection GND_1 110. When a ground-loss occurs at the external ground connection GND_1 110, the currents injected into the external ground connection GND_1 110 by the various blocks and circuitry (not shown) of the IC device 100 coupled to the external ground connection GND_1 110 will flow into the DTMOS device 210. In a DTMOS device, such as the first and second DTMOS devices 210, 220 illustrated in FIGS. 2 to 4, the body and gate of the device are tied together, as illustrated at 215, 225. This is in contrast to a conventional MOSFET (metal oxide field effect transistor) device in which the body of the device is tied to the source. Consequently, the drain current of a DTMOS device is increased at low gate voltages compared to that of a conventional MOSFET device. This behaviour of a DTMOS device may be explained as the contribution of the lateral bipolar transistor with current gains as high as 10^4, or as the reduction of the MOS threshold voltage due to forward body bias. The voltage drop across the parasitic body-source diode structure 217 resulting from the injection of current is sufficient to switch on the DTMOS device 210, enabling the injected current to flow there through to the internal ground plane GND_0 120. After a delay introduced by the RC circuit 232, 234, the resulting current through the DTMOS device 210 is mirrored by the current mirror DTMOS device 252 of the ground-loss detection component 250, causing a voltage drop across the detection resistance 254. Once the voltage drop across the detection resistance 254 exceeds the threshold voltage of the ground-loss detection PMOS device 256, it causes the ground-loss detection PMOS 256 to switch 'on', allowing current to flow there through, signalling the detection of a ground-loss at 258. The ground-loss detection signal 258 may subsequently be converted into a digital flag or other appropriate signal.

In this manner, the ground-loss detection component 250 is arranged to detect a ground-loss at the external ground connection GND_1 110 based at least partly on a drain current of the DTMOS device 210. Advantageously, the use of DTMOS devices within the ground-loss detection circuit 200, as opposed to the use of conventional MOSFET devices or the like, decreases the detection threshold voltage below the conduction threshold of parasitic diodes within the IC device 100, such as parasitic diodes in drivers or power transistors. As a result, in the event of a ground-loss, the current injected into the ground-loss detection circuit 200 will trigger the DTMOS devices before flowing through the parasitic diodes of the IC device 100. Consequently, the DTMOS-based ground-loss detection circuitry 200 is able to detect the ground-loss and also provide a safe path for the current to flow into, in the example illustrated in FIGS. 2 to 4, the internal ground plane GND_0 120, before the injected current flows through the parasitic diodes within the IC device 100, which could otherwise cause unpredictable behaviour of the IC device 100.

Furthermore, a benefit of the conventional back-to-back diode arrangement for providing ESD protection illustrated in FIG. 1, is that regular back-to-back diodes are small enough to be placed under the respective external ground connection pads of the IC device 100, thereby minimising the impact on silicon area of such ESD protection. Advantageously, the use of DTMOS devices within the ground-loss detection circuit 200 as illustrated in FIG. 2 further enables the ground-loss detection circuit 200 to also be small enough to be placed under the ground connection pads, and thus also minimising any cost impact in terms of silicon area.

Figure 5:
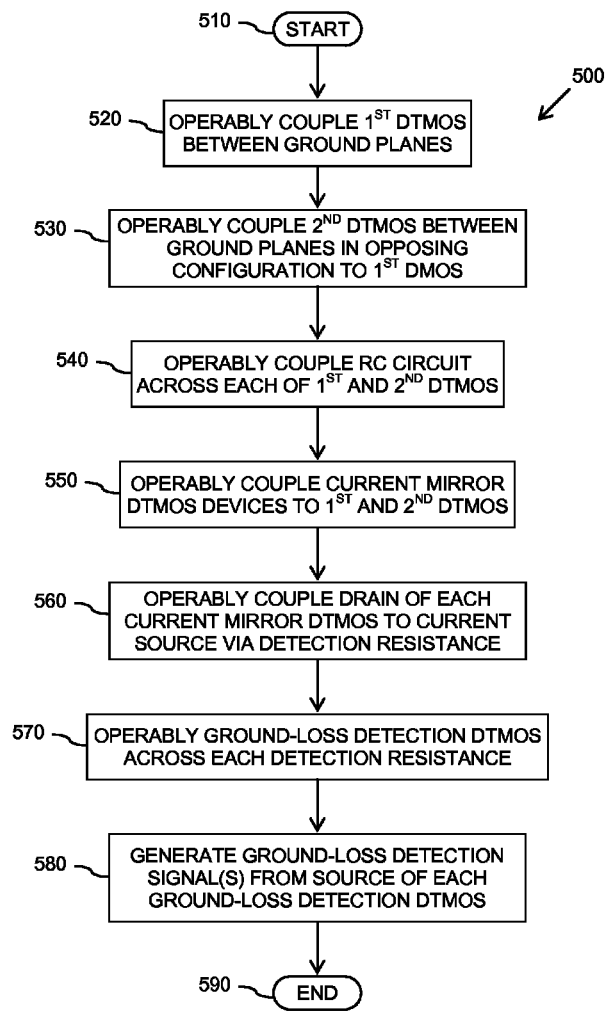
FIG. 5 illustrates a simplified flowchart of an example of a method of providing ground-loss detection within an integrated circuit device.

Referring now to FIG. 5, there is illustrated a simplified flowchart 500 of an example of a method of providing ground-loss detection within an IC device, such as the IC device 100 of FIG. 1. The method starts at 510, and moves on to 520 where a first DTMOS device is operably coupled between a first ground plane of the IC device and a second ground plane of the IC device, at least one of the first and second ground planes comprising an external ground connection of the IC device. For example, a drain and gate of the first DTMOS device may be operably coupled to the first ground plane, and a source of the first DTMOS device may be operably coupled to the second ground plane. Next, at 530, a second DTMOS device is operably coupled between the first and second ground planes of the IC device in an opposing manner to the first DTMOS device. For example, a drain and gate of the second DTMOS device may be operably coupled to the second ground plane, and a source of the second DTMOS device may be operably coupled to the first ground plane.

An RC circuit may then be operably coupled across each of the first and second DTMOS device 2, at 540.

A current mirror DTMOS device is then operably coupled to one or more of the first and second DTMOS devices and arranged to form a current mirror configuration therewith, at 550. Next, at 560, a drain of the (or each) current mirror DTMOS device is operably coupled to a current source via at least one detection resistance. A ground-loss detection PMOS device is then operably coupled across the (or each) detection resistance, at 570, such that a gate and source of the (or each) ground-loss detection PMOS device are operably coupled across the respective detection resistance. One or more ground-loss detection signals are then generated from the (or each) drain of the (or each) ground-loss detection PMOS device(s) at 580, and the method ends at 590.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the term "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A ground-loss detection circuit for an integrated circuitry (IC) device; the ground-loss detection circuit comprising:
    a first dynamic threshold metal oxide semiconductor (DTMOS) device operably coupled between a first ground plane of the IC device and at least one further ground plane of the IC device, at least one of the first and at least one further ground planes comprising an external ground connection of the IC device;
    at least one further DTMOS device operably coupled between the first and at least one further ground planes of the IC device in an opposing manner to the first DTMOS device; and
    at least one ground-loss detection component operably coupled to at least one of the first and at least one further DTMOS devices and arranged to detect a ground-loss for at least one of the first and at least one further ground planes based at least partly on a drain current of the at least one of the first and at least one further DTMOS devices.

2. The ground-loss detection circuit of claim 1, wherein:
    a drain and a gate of the first DTMOS device are operably coupled to the first ground plane, and a source of the first DTMOS device is operably coupled to the at least one further ground plane; and
    a drain and a gate of the at least one further DTMOS device are operably coupled to the at least one further ground plane, and a source of the at least one further DTMOS device is operably coupled to the first ground plane.

3. The ground-loss detection circuit of claim 1, wherein at least one resistance and capacitance circuit is operably coupled across at least one of the first and at least one further DTMOS devices.

4. The ground-loss detection circuit of claim 3, wherein the at least one ground-loss detection component is operably coupled to the at least one of the first and at least one further DTMOS devices via a resistance element of the at least one resistance and capacitance circuit.

5. The ground-loss detection circuit of claim 1, wherein the at least one ground-loss detection component comprises at least one current mirror DTMOS device arranged to form a current mirror configuration with the at least one of the first and at least one further DTMOS devices.

6. The ground-loss detection circuit of claim 5, wherein a drain of the at least one current mirror DTMOS device is operably coupled to a current source via at least one detection resistance, and the at least one ground-loss detection component is arranged to detect a ground-loss for the at least one of the first and at least one further ground planes based at least partly on a voltage drop across the at least one detection resistance.

7. The ground-loss detection circuit of claim 6, wherein the at least one ground-loss detection component further comprises at least one ground-loss detection p-channel metal oxide semiconductor (PMOS) device; a gate and a source of the at least one ground-loss detection PMOS device are operably coupled across the at least one detection resistance, and a drain of the at least one ground-loss detection PMOS device providing a ground-loss detection signal.

8. The ground-loss detection circuit of claim 1, wherein the ground-loss detection circuit is implemented within the IC device.

9. A method performed by an integrated circuit (IC) device for providing ground-loss detection within the IC device; the method comprising:
    operably coupling a first dynamic threshold metal oxide semiconductor (DTMOS) device between a first ground plane of the IC device and at least one further ground plane of the IC device, at least one of the first and at least one further ground planes comprising an external ground connection of the IC device; operably coupling at least one further DTMOS device between the first and at least one further ground planes of the IC device in an opposing manner to the first DTMOS device; and
    operably coupling at least one ground-loss detection component to at least one of the first and at least one further DTMOS devices such that the at least one ground-loss detection component is arranged to detect a ground-loss for the at least one of the first and at least one further ground planes based at least partly on a drain current of the at least one of the first and at least one further DTMOS devices.

10. The method of claim 9, further comprising: operably coupling a drain and a gate of the first DTMOS device to the first ground plane, and a source of the first DTMOS device is operably coupled to the at least one further ground plane; and operably coupling a drain and a gate of the at least one further DTMOS device to the at least one further ground plane, and a source of the at least one further DTMOS device is operably coupled to the first ground plane.

11. The method of claim 9, further comprising operably coupling at least one resistance and capacitance circuit across at least one of the first and at least one further DTMOS devices.

12. The method of claim 11, further comprising operably coupling the at least one ground-loss detection component to the at least one of the first and at least one further DTMOS devices via a resistance element of the at least one resistance and capacitance circuit.

13. The method of claim 9, wherein the at least one ground-loss detection component comprises at least one current mirror DTMOS device arranged to form a current mirror configuration with the at least one of the first and at least one further DTMOS devices.

14. The method of claim 13, further comprising operably coupling a drain of the at least one current mirror DTMOS device to a current source via at least one detection resistance, and arranging the at least one ground-loss detection component to detect a ground-loss for the at least one of the first and at least one further ground planes based at least partly on a voltage drop across the at least one detection resistance.

15. The method of claim 14, wherein the at least one ground-loss detection component further comprises at least one ground-loss detection p-channel metal oxide semiconductor (PMOS) device, the method further comprising operably coupling a gate and a source of the at least one ground-loss detection PMOS device across the at least one detection resistance, and a drain of the at least one ground-loss detection PMOS device providing a ground-loss detection signal.

* * * * *